US010628077B2

(12) United States Patent
Gouda et al.

(10) Patent No.: US 10,628,077 B2
(45) Date of Patent: Apr. 21, 2020

(54) SYSTEM TO ACQUIRE ANALOG TO DIGITAL (ADC) DATA USING HIGH END TIMER (N2HET) AND HIGH END TIMER TRANSFER UNIT (HTU)

(71) Applicant: Goodrich Aerospace Services Private Limited, Bangalore, Karnataka (IN)

(72) Inventors: Gopikrishna Gouda, Bangalore (IN); Sharif Shaik, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 151 days.

(21) Appl. No.: 15/983,122

(22) Filed: May 18, 2018

(65) Prior Publication Data

US 2019/0294361 A1 Sep. 26, 2019

(30) Foreign Application Priority Data

Mar. 23, 2018 (IN) .............................. 201811010828

(51) Int. Cl.
*H03M 1/00* (2006.01)
*G06F 3/06* (2006.01)
(Continued)

(52) U.S. Cl.
CPC ............ *G06F 3/0655* (2013.01); *G06F 3/061* (2013.01); *G06F 3/0673* (2013.01); *G06F 13/28* (2013.01); *H03M 1/12* (2013.01)

(58) Field of Classification Search
CPC ........ H03M 1/12; G06F 13/4027; G06F 3/05; G06F 11/2236; G06F 13/16; G06F 13/24;
(Continued)

(56) References Cited

U.S. PATENT DOCUMENTS 5,898,761 A * 4/1999 McHale .............. H04L 12/2856
379/93.01
6,128,681 A * 10/2000 Shephard ............... H04H 60/04
710/38
(Continued)

FOREIGN PATENT DOCUMENTS

CN 205407785 U 7/2016

OTHER PUBLICATIONS

Extended European Search Report for European Application No. 19164888.0; Date of Completion: Jul. 31, 2019; dated Aug. 14, 2019; 10 Pages.
(Continued)

*Primary Examiner* — Linh V Nguyen
(74) *Attorney, Agent, or Firm* — Cantor Colburn LLP

(57) ABSTRACT

A method of converting and acquiring external analog data without central processing unit (CPU) intervention using high-end timer unit (N2HET) and High End Timer Transfer Unit (HTU) to overcome serial peripheral interface (SPI) and external memory interface (EMIF) limitations encountered while performing high speed transfers. The method includes connecting a conversion start pin, a chip select (CS) pin, a read enable pin, a converter busy pin and data pins of an analog to digital converter (ADC) with the pins of the N2HET. The N2HET is configured to perform ADC data conversion and acquisition by performing steps of: activating a conversion start signal on the CS pin until a deactivation of the converter busy pin; and generating an HTU request to transfer data from a data N2HET pin to a N2HET random access memory (RAM) unit via a data transfer channel and then from N2HET RAM to RAM of the CPU.

20 Claims, 5 Drawing Sheets

(51) Int. Cl.
*G06F 13/28* (2006.01)
*H03M 1/12* (2006.01)

(58) Field of Classification Search
CPC ........ G06F 13/4282; G06F 1/26; G06F 3/023;
G06F 3/038; G06F 3/1454; G06F 3/061;
G06F 3/0655; G06F 3/0673
USPC .......... 341/141, 142, 155, 161, 162
See application file for complete search history.

(56) References Cited

U.S. PATENT DOCUMENTS

| | | | | |
|---|---|---|---|---|
| 6,255,972 | B1 * | 7/2001 | Gross, Jr. | H03M 1/02 |
| | | | | 341/126 |
| 6,513,085 | B1 * | 1/2003 | Gugel | G06F 13/405 |
| | | | | 370/438 |
| 6,587,942 | B1 * | 7/2003 | Chiang | H03M 9/00 |
| | | | | 710/11 |
| 6,633,905 | B1 * | 10/2003 | Anderson | G06F 1/26 |
| | | | | 709/219 |
| 6,701,395 | B1 * | 3/2004 | Byrne | G06F 3/05 |
| | | | | 341/141 |
| 6,728,814 | B2 * | 4/2004 | Leinen | G01R 31/31855 |
| | | | | 710/14 |
| 6,792,494 | B2 * | 9/2004 | Bennett | G06F 13/385 |
| | | | | 370/535 |
| 6,823,416 | B1 * | 11/2004 | Dempsey | H03M 1/662 |
| | | | | 341/144 |
| 7,369,078 | B2 | 5/2008 | Nickel et al. | |
| 2002/0118475 | A1 * | 8/2002 | Ng | G11B 5/012 |
| | | | | 360/46 |
| 2004/0169738 | A1 | 9/2004 | Fujimoto | |
| 2010/0245148 | A1 * | 9/2010 | Adamo | G06F 13/28 |
| | | | | 341/155 |
| 2014/0089536 | A1 * | 3/2014 | Pedersen | H03M 1/1215 |
| | | | | 710/22 |

OTHER PUBLICATIONS

Texas Instruments, "RM57L843 Hercules Microcontroller Based on the ARM Cortex-R Core", SPNS215C—Feb. 2014—Revised Jun. 2016, 222 pages.

* cited by examiner

| PIN NUMBER | SIGNAL TO/FROM ADC | DIRECTION FOR N2HET | PULL ENABLED | PULL DIRECTION |
|---|---|---|---|---|
| 0 | CONVERSION | OUTPUT | YES | DOWN |
| 1 | BUSY | INPUT | YES | DOWN |
| 2 | ChipSelect & READ | OUTPUT | YES | DOWN |
| 8-23 | PARALLEL DATA | INPUT | YES | DOWN |

SYSTEM TO ACQUIRE ANALOG TO DIGITAL (ADC) DATA USING HIGH END TIMER (N2HET) AND HIGH END TIMER TRANSFER UNIT (HTU)

FOREIGN PRIORITY

This application claims priority to Indian Patent Application No. 201811010828 filed Mar. 23, 2018, the entire contents of which is incorporated herein by reference.

BACKGROUND

Exemplary embodiments pertain to the art of analog to digital data transfer systems, specifically to a system to acquire analog to digital data using N2HET and HTU.

External Analog to Digital Converters (ADCs) are used due to several advantages over internal ADCs such as higher conversion speed, higher resolution, improved accuracy, etc. As the speed of ADCs increase, the faster the interface (from microcontroller side) must trigger, convert data, detect changes in the signal, etc. These system requirements are often felt in demanding applications like motor control. The traditional way of acquiring samples from external ADCs include using a serial peripheral interface (SPI) bus and external memory interface (EMIF). Since SPI is a serial transfer method, it can be slow. This speed reduction can be made worse because the SPI clock is limited to certain speed on most of the microcontrollers (around 20 MHz). Although EMIF is a parallel interface, it may not be suited to interface with all ADCs. The only way to use EMIF is through DMA to save CPU time for other critical tasks. DMA bandwidth for EMIF may become limited for following reasons.

Micro Controllers using Direct Memory Access (DMA) peripheral can face a bottleneck in systems with demanding applications like continuous excitation. For example, some applications require up to six channels of DMA at a rate of 10 KHz per channel. Further, DMA may be needed by several peripherals like SCI, I2C, etc for their data transfer needs. Using the central processing unit (CPU) for such tasks can result in undue system interruptions, which can also introduce system unreliability.

BRIEF DESCRIPTION

Disclosed is the method which overcomes the limitations of SPI and EMIF for ADC conversion and acquisition.

In one embodiment, a method of converting and acquiring external analog data without central processing unit (CPU) intervention using high-end timer unit (N2HET) and High End Timer Transfer Unit (HTU) to overcome serial peripheral interface (SPI) and external memory interface (EMIF) limitations encountered while performing high speed transfers is disclosed. The method includes connecting a conversion start pin, a chip select (CS) pin, a read enable pin, a converter busy pin and data pins of an analog to digital converter (ADC) with the pins of the N2HET. The N2HET is configured to perform ADC data conversion and acquisition by performing steps of: activating a conversion start signal on the CS pin until a deactivation of the converter busy pin; and generating an HTU request to transfer data from a data N2HET pin to a N2HET random access memory (RAM) unit via a data transfer channel and then from the N2HET RAM to RAM of the CPU.

Also disclosed is a non-transitory computer readable medium storing program instructions for performing the some or all of the above method.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
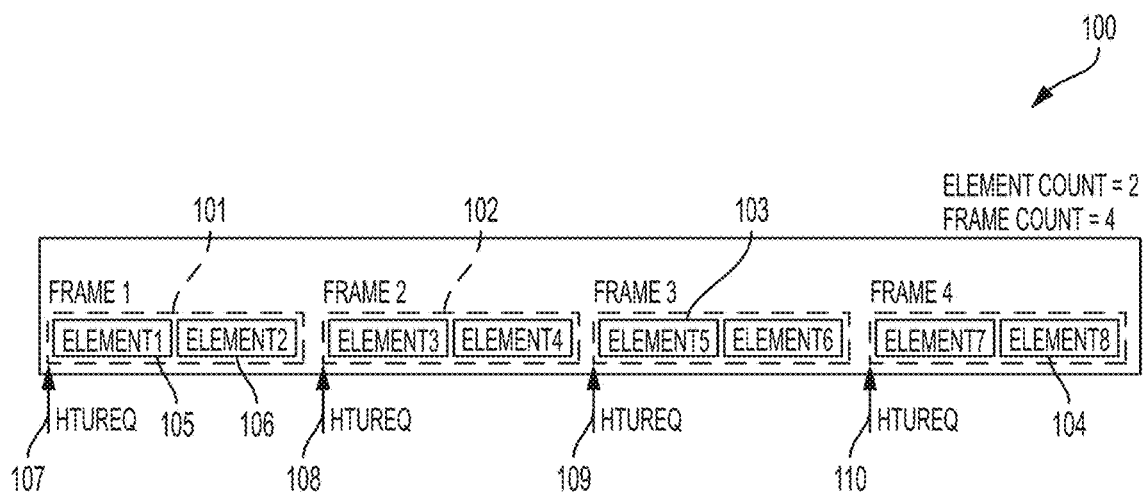
FIG. 1 depicts a High-End Timer Transfer Unit (HTU) request and transfer scheme according to an embodiment.

A detailed description of one or more embodiments of the disclosed apparatus and method are presented herein by way of exemplification and not limitation with reference to the Figures.

Before describing embodiments in detail, an overview of two technologies associated with the present invention will be briefly discussed. The first technology is a reduced instruction set micro machine called a N2HET unit or timer. Many families of microcontrollers include a specialized micro-machine that operates on timer. Along with timers, two 25-bit registers and three 32-bit registers are available. Information stored in these registers can be manipulated. The information may be, for example, time data, event count data, or other data types. N2HET includes instruction memory that is typically initialized by the CPU or by a direct memory access (DMA) peripheral with the desired N2HET assembly program after a system reset, before the timer machine starts execution. The N2HET is supplied with a clock from the main source. The N2HET needs to maintain counters using registers, compare them with dynamically loaded values from the CPU, and make decisions such as toggling pins, triggering its dedicated transfer unit (HTU), reading pins etc.

The timer program is a set of instructions executed sequentially. Reaching the end, the N2HET program must roll to the first instruction so that it runs in a loop. The time for a loop to execute is referred to as a loop resolution period (LRP). When the N2HET rolls over to the first instruction, the timer waits for the loop resolution clock to restart the execution of the loop to ensure that only one loop is executed for each loop resolution period. The longest path through N2HET instructions must be completed within the loop resolution is the clock (LRP). Otherwise, the program will execute unpredictably because some instructions will be left unexecuted. This constraint creates a strong link between the accuracy of the timer functions and the number of functions (instructions) the timer can perform. Using these instructions, the counter can be incremented or decremented, registers can be manipulated, general purpose pins can be activated or deactivated, values on the pins can read, HTU requests can be generated etc.

The second of the two technologies is a high-end timer transfer unit (HTU). The HTU is similar to the Direct Memory Access (DMA) module but is a special transfer unit for N2HET. The HTU is like a local DMA to the N2HET module that allows data transfer to and from main RAM from and to the N2HET RAM.

Transfers are initiated with the help of requests generated by the N2HET program and configurable control packets. Transfers between N2HET and the main memory can be triggered by eight different HTU requests by N2HET. These requests are linked to and triggered by N2HET instructions conditionally. The control packets define address and transfer information. For example, the control packet defines the start address of the source/destination buffers, the N2HET instruction address location, the PIN address and the number of elements that need to be transferred. Once a request is triggered, it starts a frame transfer.

FIG. 1 depicts a block diagram of a High-End Timer Transfer Unit (HTU) request and transfer scheme 100 (hereafter "diagram 100"), according to an embodiment. As shown in FIG. 1, as described above, the diagram 100 depicts a HTU request having a plurality of frames 101, 102, 103, and 104. Each of the frames is depicted having two elements (e.g., element 1 (105) and element 2 (106)). A frame can contain one or more elements. Each new HTU request 107, 108, 109, and 110 triggers the transmission of a frame. For example, HTU request 107 triggers frame 101, HTU request 108 triggers frame 102, etc. Each of the frames 101-104

The elements 105, 106, etc., are defined as 32-bit or 64-bit words of data. Although two elements are shown for each of the frames 101, 102, 103, and 104, it should be appreciated that any number of elements for each frame is possible. As an example, if only one field from a single instruction should be transmitted, the count of elements in a frame would be one. But if several fields from multiple instructions should be transferred with a single HTU request, the element count should directly correspond to a number of fields to be transferred.

Figure 2:
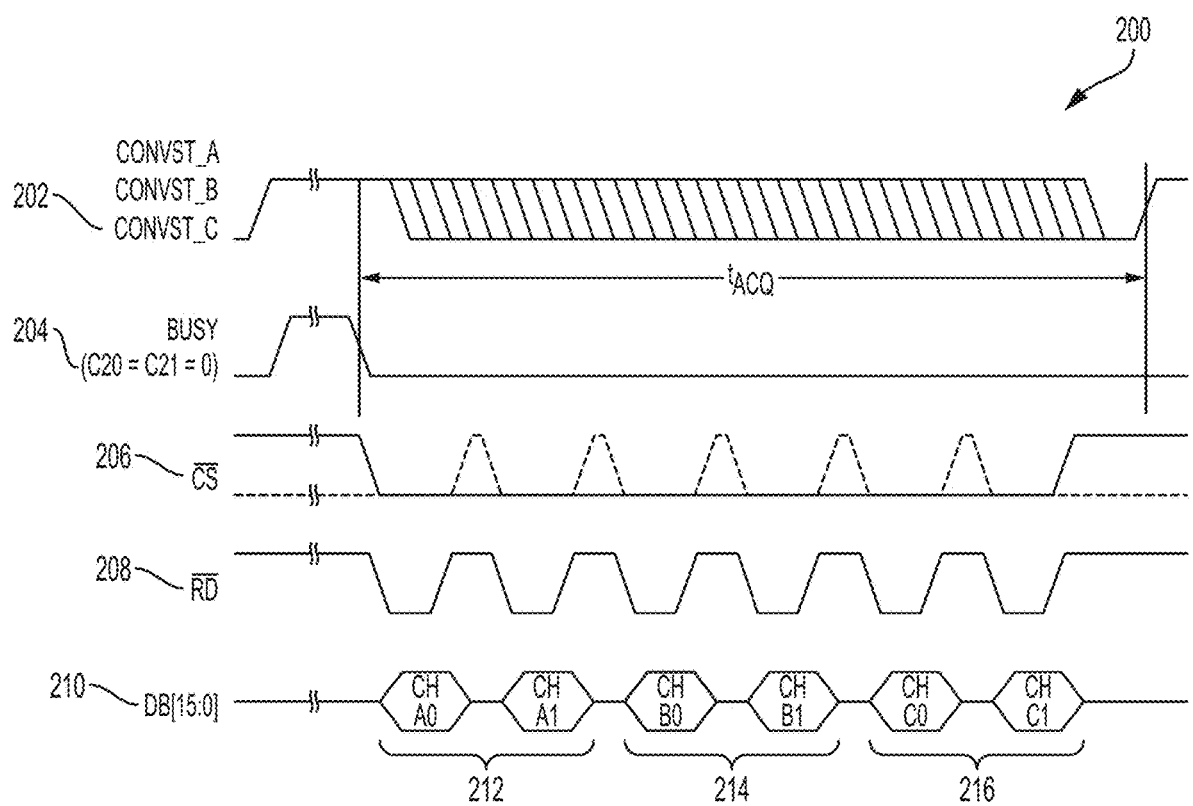
FIG. 2 is an operation timing diagram for parallel read access signals of an analog-to-digital (ADC) converter according to an embodiment.

FIG. 2 is a standard parallel read access timing diagram 200 for parallel read access signals of an analog-to-digital (ADC) converter. The diagram of FIG. 2 is a known as timing of a standard off-the-shelf ADC. Although the timing requirements of ADC devices differ, the idea of acquiring ADC data can be extended to most of the external ADCs available in the market due to the highly configurable nature of N2HET's interaction with ADCs. For example, a conventional ADC can convert and give out data in serial/parallel mode. When the ADC device is configured for parallel mode, it generally functions as shown in FIG. 2.

Referring now to FIG. 2, signal 202 depicts CONVST_A, CONVST_B, and CONVST_C, of a standard ADS8557 ADC conventionally available from Texas Instruments. The signal 202 represents rising edges of a signal initiating simultaneous conversion of analog signals at the inputs. Signal 204 represents a converter busy signal from ADC. The CS signal pin 206 is a chip select signal, indicative of a status output of the chip select input pin of the ADC. In this example, when the CS signal pin 206 is enabled (high) the interface is disabled. When signal pin 206 is low, the parallel interface is enabled. The RD signal pin 208 demonstrates a signal on a read data (read enable) input pin. When the RD signal pin 208 is low, the parallel data output is enabled, and when high, the data output is disabled. The DB signals 210 show the output data signal timing of channel pairs with respect to the pin inputs described above. The DB is a conglomeration of 16 data lines configured in parallel.

As shown in FIG. 2, A 212, B 214, and C 216 are channel pairs. For example, data streams A0 and A1 (212), data streams B0 and B1 (214), and data streams C0 and C1 (216) are shown in FIG. 2, where each data stream pair would always sampled sampled pairwise. Although outside of the scope of the present disclosure, the timing requirements of the particular device are matched to N2HET's behavior.

Figures 3, 4:
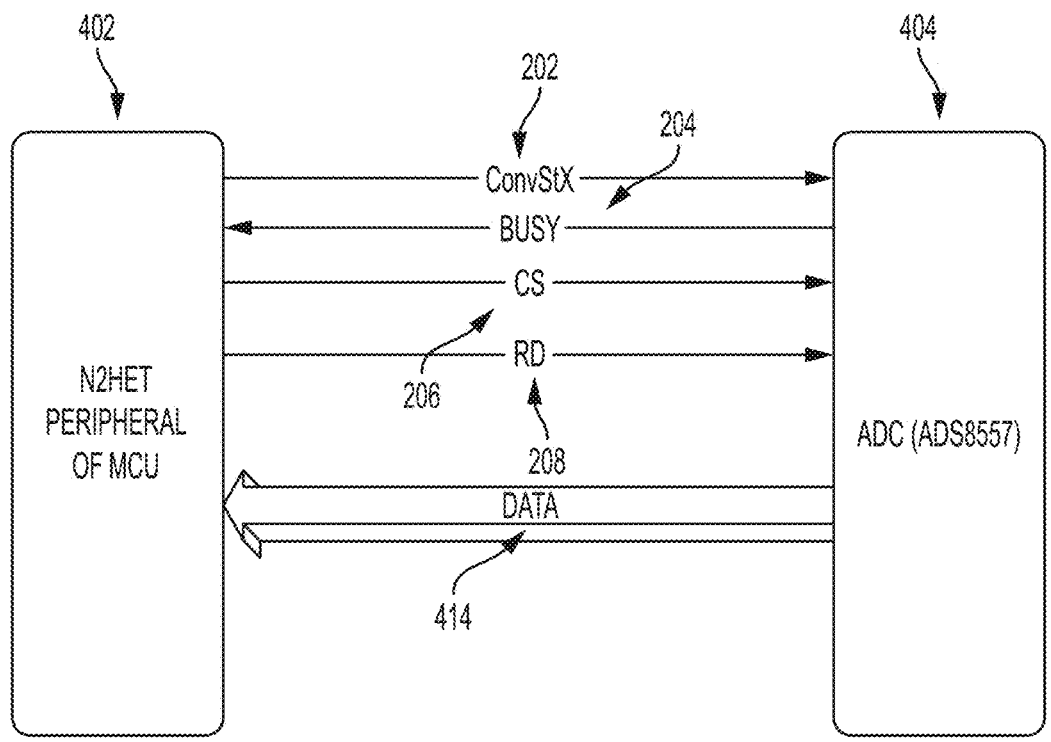
FIG. 3 is a table of N2HET1 pins connected to ADC pins according to an embodiment.
FIG. 4 is a block diagram of a connection between an N2HET peripheral and an ADC conversion unit according to an embodiment.

FIG. 3 is an exemplary pin connection table of N2HET1 pins connected to ADC pins. The N2HET has a total of 32 independently configurable pins (direction and pull can be selected). For demonstration purpose, N2HET pin 0 is connected to Conversion start (CONVST) pin of ADC, N2HET pin 1 to BUSY pin of ADC, N2HET pin 2 is parallel connected to Chip Select and Read Enable pins, N2HET pins 8-23 are connected to ADC data pins (DB) that give the converted data in parallel.

FIG. 4 is a block diagram of a connection between an N2HET peripheral 402 and an ADC conversion unit 404, according to an embodiment. The connection is configured with the pin assignment shown in FIG. 3. In the embodiment of FIG. 4 the configuration is represented in hardware. Accordingly embodiments of the present disclosure cause the hardware to function in a more efficient manner by utilizing the parallel interface thus speeding the data transfer rate Embodiments described herein both improve the state of the art of ADC data transfers by providing for acquiring data with both N2HET and HTU protocols, also without the need of CPU to involve in the entire process thus improving the functionality of the hardware with which it operates.

Figure 5:
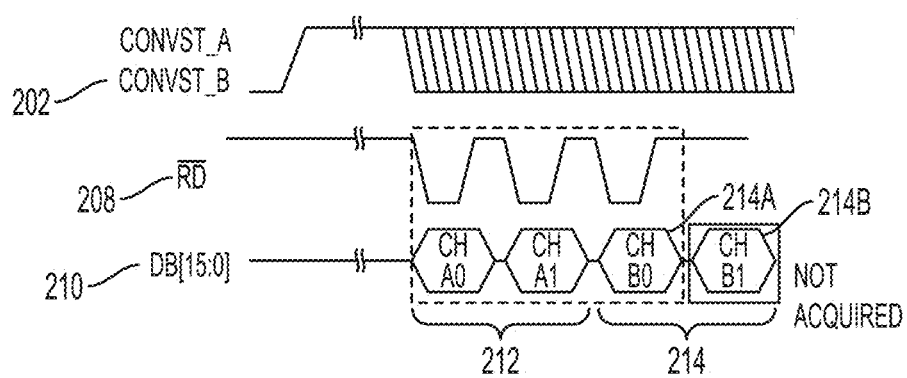
FIG. 5 depicts the conversion protocol used (3 conversion channels out of 4) according to an embodiment.

FIG. 5 depicts an HTU transfer simulation, according to an embodiment. By way of an example, if three streams of analog data were required to be sampled simultaneously (e.g., CONVST_A that includes and CONVST_B) . . . the chip select 206 and the RD signal 208 pins are tied together, hence only data A0, A1, B0, B1 come out on performing read accesses as shown in FIG. 5. Also, the chip select signal pin 206 and the read enable pin 208 can be tied together as no minimum delay is required. Before the B1 channel 214B can be acquired, the system will start conversion. This ends after three cycles, as demonstrated on the read pin 208, where the signal goes low three times, the third time being the transfer of the B0 channel 214B. One key aspect is that the present system may selectively transfer on DMA or with an HTU transfer, and the timing of the transfer is strictly controlled as demonstrated in FIG. 6. It should be noted that if DMA is chosen, the system may directly transfer data from data pins of N2HET to a system RAM buffer (not shown) according to the pin assignment chart of FIG. 3. HTU however may be slower than DMA.

Requests are divided into 2 stages as shown in FIG. 5. In the first stage, the system acquires ADC data in alternate N2HET loop resolution periods when RD is made low on three different HTU requests (channel pair A 212 having channel A0 and A1, and 214A having channel B0). The transfer acquires data to N2HET RAM. The other stage is where previously acquired data is transferred from N2HET RAM to Microcontroller RAM this happens buffer 4 loop cycles later.

Figure 6:
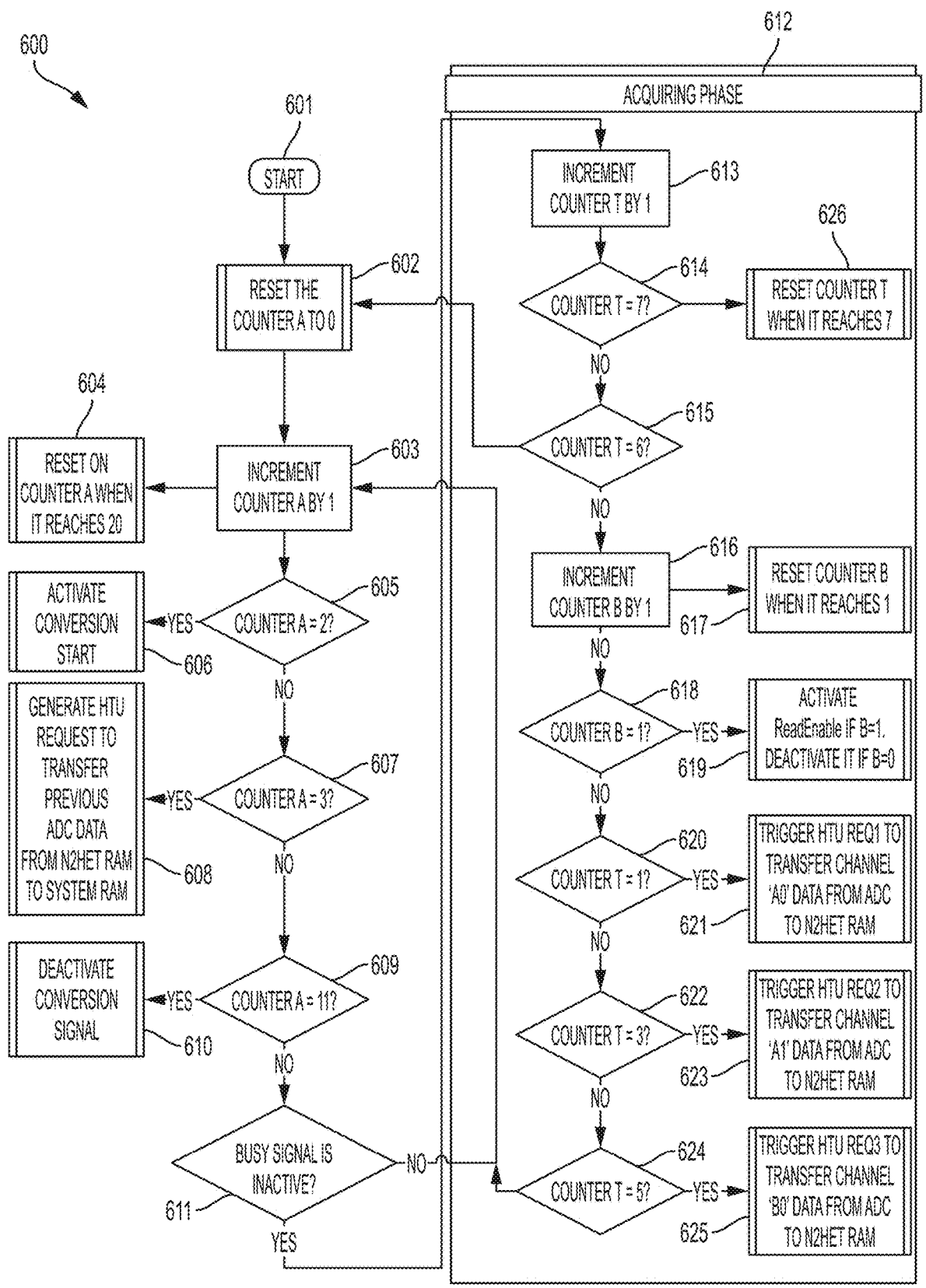
FIG. 6 depicts a flow diagram of a method for acquiring ADC data using N2HET and HTU according to an embodiment.

FIG. 6 is a flow diagram of the proposed method 600 for acquiring ADC data using N2HET and HTU, according to an embodiment. The transfer triggering scheme described with respect to FIG. 6 provides ample time for HTU transfers hence certainty in transfers.

The entire flow depicted in FIG. 6 will be run over and over again. After an initial starting step 601, the counter A starts from 0, as shown in block 602.

As shown in block 603, the processor increments a counter A by 1, and resets counter A to 0 when it reaches 20. This is done to start a new conversion and also as a safety measure so that if ADC takes too long to respond at block 611, the N2HET can start a conversion request over again.

At the decision block 605, the processor determines whether the counter A is equal to 2. If it is greater than equal to 2, the system activates the conversion, as shown in block 606. By activating the conversion, data conversion from analog to digital begins.

The N2HET processor determines whether the counter A is equal to 3, as shown in block 607. When the counter A is equal to 3, the processor generates an HTU request to transfer data from N2HET RAM to the system RAM buffer (actual microcontroller RAM), as shown in block 608. This is the previously acquired data from ADC pins collected while executing the blocks 621, 623, 625.

At decision block 609 the processor determines whether the counter A is equal to 11, then deactivates conversion signal when A is equal to 11 (as shown in block 610).

At decision block 611, the N2HET determines whether the busy signal 204 is inactive (i.e., low voltage on the busy pin 204). When the busy signal pin 204 is inactive, the system goes to the acquiring phase 612. While the busy signal pin 204 continues to be active, the system continues to increment the counter A by 1 (block 603).

At the acquiring phase 612, the processor increments a second counter T by 1, as shown in block 613. Alternatively, at block 626, the same incrementing instruction resets the counter T to 0 when it reaches 7 so that 3 counts account for activating Read alternatively, 3 counts account for deactivating Read alternatively and 1 for resetting A.

At decision block 614, the system determines whether the counter T is equal to 7, and resets counter T back to 0.

At decision block 615 the system determines whether the counter T is equal to 6, and returns to the reset block 602 if the determination is "yes".

When the system determines that the counter T is not equal to 6, the system increments a third counter B by 1. The same instruction resets counter B to be equal to 0 next time it is executed at block 617.

At block 618, the system determines whether the counter B is equal to 1, the Read pin will be activated, which makes the external ADC output the converted data on the parallel pins (DB), then at block 619, activates the read enable pin 208 if B is equal to 1 (by making the RD pin go low), and deactivates the read enable pin if B is equal to 0 (by making the RD pin go high).

At decision block 620 the system determines whether T is equal to 1, and triggers the HTU REQ1 pin when T is equal to 1 (as shown in block 621). During this step, the system transfers data between data from ADC pins to N2HET RAM. This will fetch the ADC Channel A0 converted data from N2HET data pins (same as DB pins of ADC) into the N2HET RAM.

At block 622, when T is equal to 3, the system triggers the high end transfer unit (HTU) REQ2 (fetching Channel A1 converted data) pin as shown in block 623. If not, the system determines whether the counter T is equal to 5 at decision block 624. When yes, the system triggers HTU REQ3 (fetching Channel B0 converted data), as shown in block 625.

Figure 7:
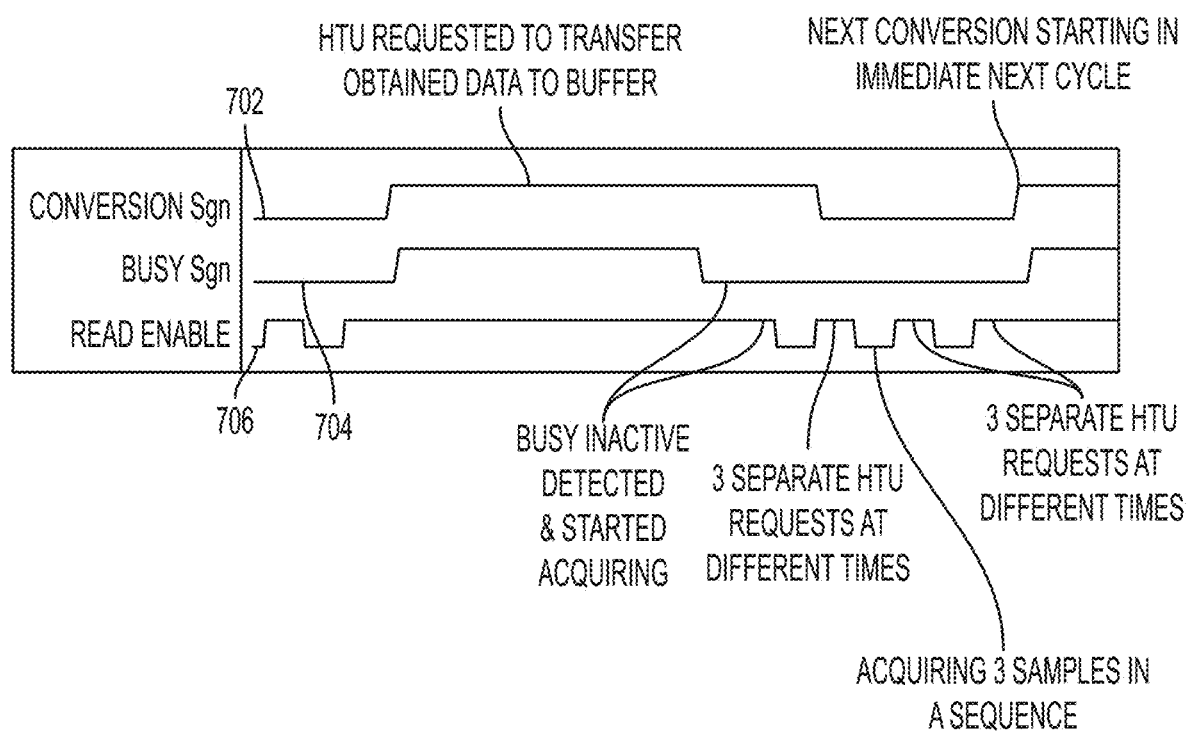
FIG. 7 depicts an exemplary output according to embodiments described herein.

FIG. 7 depicts an exemplary output according to embodiments described herein. Referring now to FIG. 7, signal 702 is a conversion signal, signal 704 is a busy signal, and signal 706 is a read enable signal. The conversion signal 702 is low until it is activated (signal high). At this point of going high, the conversion starts. After the conversion signal 702 goes high, it can be noticed that HTU transfers the data from N2HET RAM (same as external ADC data from previously acquired loops) gets transferred to system RAM.

The busy signal then goes high indicating that the ADC conversion is active. After a period of time, the busy signal goes low, meaning that the conversion is ready for transfer. Notably the conversion signal is still kept high as a safe measure at this point.

After the BUSY signal goes low, indicating that conversion by ADC device has finished, it can be noticed that Read Enable pin is toggled multiple times to acquire data and separate HTU requests are generated after the converted data is available on the N2HET pins.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of converting and acquiring external analog data without central processing unit (CPU) intervention using high-end timer unit (N2HET) and High End Timer Transfer Unit (HTU) to overcome serial peripheral interface (SPI) and external memory interface (EMIF) limitations encountered while performing high speed transfers, the method comprising:
connecting a conversion start pin, a chip select (CS) pin, a read enable pin, a converter busy pin and data pins of an analog to digital converter (ADC) with the pins of the N2HET;
the N2HET configured to perform ADC data conversion and acquisition by performing steps of:
activating a conversion start signal on the CS pin until a deactivation of the converter busy pin; and
generating an HTU request to transfer data from a data N2HET pin to a N2HET random access memory (RAM) unit via a data transfer channel and then from the N2HET RAM to RAM of the CPU.

2. The method of claim 1, wherein ADC data conversion is triggered by driving the conversion start pin high with the N2HET.

3. The method of claim 2, wherein the converter busy pin is sampled by the N2HET to detect end of conversion.

4. The method of claim 3, wherein the ADC data conversion is released by driving the conversion start pin low with the N2HET after ADC conversion end is detected.

5. The method of claim 1, wherein the CS pin of ADC is triggered and deactivated using the N2HET.

6. The method of claim 1, wherein activation and deactivation of ADC read pin is controlled by the N2HET.

7. The method of claim 1, wherein converted data from the ADC is acquired by the N2HET using multiple N2HET pins.

8. The method of claim 1, wherein the HTU is used to acquire converted data from the N2HET and thereby receiving the converted data from the ADC.

9. The method of claim 8, wherein an HTU request to receive the converted data is triggered while toggling the read pin while the N2HET is acquiring data from the ADC.

10. The method of claim 1, wherein an HTU request is generated to transfer previously acquired data from N2HET RAM to the RAM of the CPU.

11. The method of claim 10, wherein the HTU request is generated in a next ADC conversion after the previously acquired data was received.

12. The method of claim 1, wherein more than one ADC signals are acquired.

13. A non-transitory computer readable medium storing program instructions for causing a processor to acquire and convert external analog data without central processor unit (CPU) intervention using a high-end timer unit (N2HET) and a High End Timer Transfer Unit (HTU) to overcome SPI and EMIF limitations encountered while performing high speed transfers in a system that includes that includes an analog to digital converter (ADC) a conversion start pin, a chip select (CS) pin, a read enable pin, a converter busy pin and data pins connected to pins of the N2HET, the method comprising:
  activating a conversion start signal on the CS pin until a deactivation of the converter busy pin; and
  generating an HTU request to transfer data from a data N2HET pin to a N2HET random access memory (RAM) unit via a data transfer channel and then from the N2HET RAM to RAM of the CPU.

14. The medium of claim 13, wherein ADC data conversion is triggered by driving the conversion start pin high with the N2HET.

15. The medium of claim 14, wherein the converter busy pin is sampled by the N2HET to detect end of conversion.

16. The medium of claim 15, wherein the ADC data conversion is released by driving the conversion start pin low with the N2HET after ADC conversion end is detected.

17. The medium of claim 13, wherein the CS pin of ADC is triggered and deactivated using the N2HET.

18. The medium of claim 13, wherein activation and deactivation of ADC read pin is controlled by the N2HET.

19. The medium of claim 13, wherein converted data from the ADC is acquired by the N2HET using multiple N2HET pins.

20. The medium of claim 13, wherein the HTU is used to acquire converted data from the N2HET and thereby receiving the converted data from the ADC.

* * * * *